(12) United States Patent
Schenkel et al.

(10) Patent No.: US 7,126,139 B2
(45) Date of Patent: Oct. 24, 2006

(54) DEVICE AND METHOD OF POSITIONALLY ACCURATE IMPLANTATION OF INDIVIDUAL PARTICLES IN A SUBSTRATE SURFACE

(75) Inventors: Thomas Schenkel, San Francisco, CA (US); Ivo W. Rangelow, Baunatal (DE); Jan Meijer, Bochum (DE)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/683,488

(22) Filed: Oct. 9, 2003

(65) Prior Publication Data

US 2005/0077486 A1 Apr. 14, 2005

(51) Int. Cl.
*G02B 6/26* (2006.01)
*H01J 37/00* (2006.01)

(52) U.S. Cl. .............. 250/492.22; 250/491.1; 250/492.21; 250/492.23

(58) Field of Classification Search .......... 250/492.1, 250/492.2, 492.21, 492.22, 492.23, 493.1
See application file for complete search history.

(56) References Cited

U.S. PATENT DOCUMENTS

2002/0076184 A1 6/2002 Iyoki

FOREIGN PATENT DOCUMENTS

WO  WO 02/077986 A2  10/2002
WO  WO 03/019635 A1  3/2003

OTHER PUBLICATIONS

Luthi et al., "Parallel nanodevice fabrication using a combination of shadow mask and scanning probe methods," Jun. 28, 1999, Applied Physics Letters, vol. 75, No. 9, Aug. 30, 1999, pp. 1314-1316.*

* cited by examiner

*Primary Examiner*—Nikita Wells
*Assistant Examiner*—David A. Vanore
(74) *Attorney, Agent, or Firm*—Michelle Chew Wong; Lawrence Berkeley; National Laboratory

(57) ABSTRACT

A device and a method for positionally accurate implantation of individual particles in a substrate surface (1a) are described. A diaphragm for a particle beam to be directed onto the substrate surface (1a) and a detector provided thereon in the form of a p-n junction for determining a secondary electron flow produced upon impact of a particle onto the substrate surface (1a) are provided on a tip (4) which is formed on a free end portion of a flexible arm (2) to be mounted on one side. The device is part of a scanning device operating according to the AFM method.

27 Claims, 4 Drawing Sheets

Figure 1:
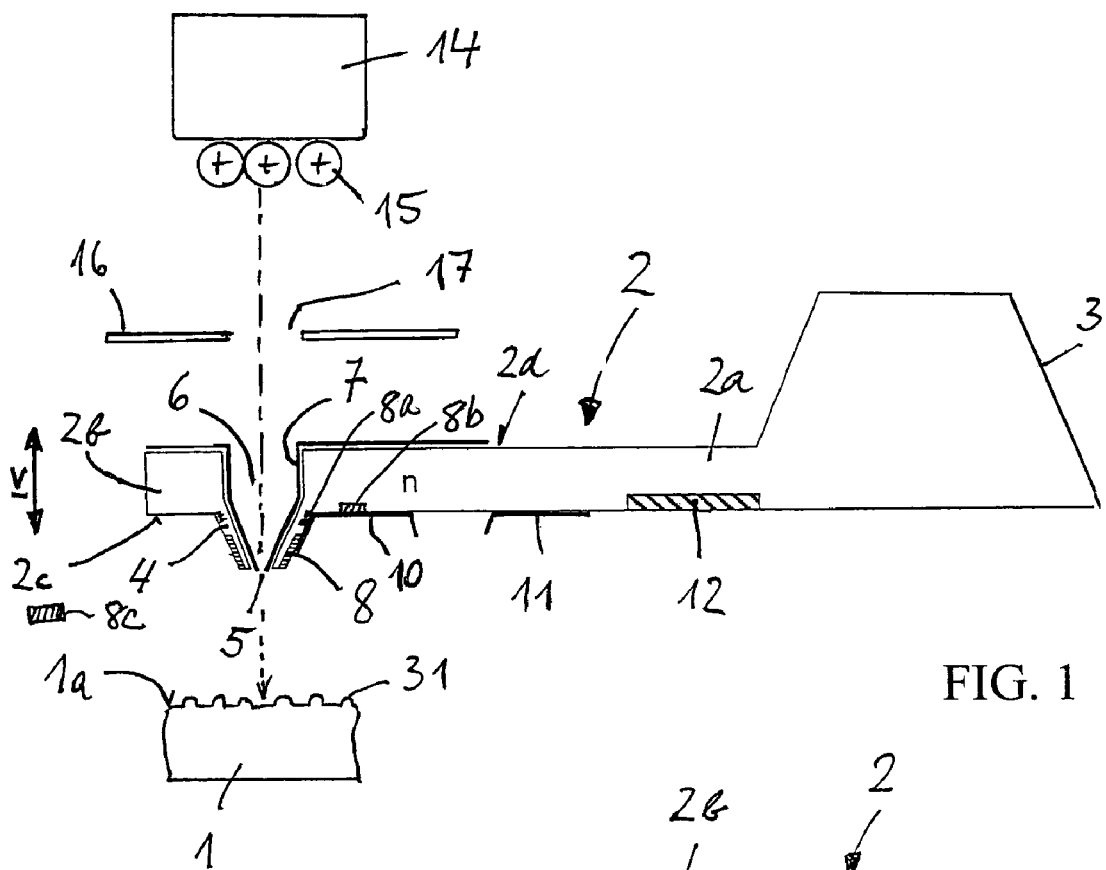

DEVICE AND METHOD OF POSITIONALLY ACCURATE IMPLANTATION OF INDIVIDUAL PARTICLES IN A SUBSTRATE SURFACE

The invention relates to devices according to the preambles of claim 1 and 10 and a method according to the preamble of claim 11.

Constantly progressing miniaturisation of electronic components has become possible inter alia due to the development of nanotechnological tools. An example of this miniaturisation is represented by the super fast quantum computer which stores binary data in so-called qubits. This thereby concerns quantum-mechanical systems, such as e.g. individual nuclear spins with the spin orientations "up" and "down" which can be manipulated according to the rules of quantum mechanics. The functions of logic and memory components for this purpose are determined by individual doping atoms, which are disposed e.g. in a grating-like or chequered distribution and at spacings of e.g. 10 nm to 20 nm, maximum 100 nm, in the surface of a substrate formed for example from silicon.

For positionally accurate implantation of particles of this type in the substrate surface, not only is an exact positioning of the particles required but also proof of the fact that the implantation of a particle has taken place. As soon as a particle is implanted, the process must be halted and the particle flow must be directed to the next position in order to avoid the implantation of a plurality of particles at the same position. Devices and methods of the initially described types for implementing such an implantation are known (e.g. T. Schenkel et al in "Single ion implantation for solid state quantum computer development" J. Vac. Sci. Technol. B 20 (6), November/December 2002, pp. 2819 to 2823), by means of which a low-energy beam of ions (e.g. $^{31}P^{q+}$ ions) is directed through a diaphragm aperture onto a substrate surface. The secondary electron flow produced upon impact of the ion on the substrate surface is regarded as proof of the implantation of an individual ion. As soon as an electrical signal caused by the secondary electron emission appears, the next position is targeted.

The known device contains as diaphragm a thin membrane with an essentially cylindrical hole which has a diameter of e.g. 5 nm to 30 nm. The membrane is disposed above the substrate surface and formed on its underside in the manner of an electron multiplier (channel plate detector). The movements of the substrate are effected with a coordinate table which can be moved by means of piezoelectric drives in the three directions x, y and z of a Cartesian coordinate system. Further details can be deduced from the mentioned document J. Vac. Sci. Technol. B. 20 (6) which is herewith made the subject of the present disclosure by reference.

The described device is not optimally suited for commercial implantations of the described type. One main reason for this resides in the fact that the essentially plane-parallel membrane or diaphragm with the detector mounted thereon cannot be brought sufficiently close to the substrate surface during the implantation process. This prevents on the one hand the comparatively large spatial extension of the detector. On the other hand, the substrate surface is provided before implantation preferably in a grating-like manner with imprinted or otherwise applied, e.g. 50 nm high lines, points or the like which enable a permanent position detection in fact as structures extending in the z direction and define between themselves grating fields for positioning the particles but also establish as a result a minimum spacing of the membrane to the substrate surface. In addition, a normal coordinate table does not enable the detection of structures of this type so that either additional means are provided for this purpose or the advantages of positioning aids of this type must be dispensed with.

The technical problem of the present invention resides therefore in improving the devices and the method of the initially described types so that the diaphragm or the hole thereof can be disposed closer to the substrate surface and nevertheless its positioning can be undertaken precisely and using structures extending in the z direction.

The characterising features of claims 1, 10 and 11 serve to achieve this object.

The invention includes the advantage that the flexible arm (cantilever) can be provided with a very finely tapering tip using conventional means. This tip can therefore be brought very close to the substrate surface between possible structure extending the in z direction even if it is provided in addition with a detector on its outer surface. This applies in particular when the detector is formed according to a preferred embodiment as a diode provided with a p-n junction, the spatial extension of said diode being able to be kept relatively small. Finally the invention makes it possible to combine the device with a power scanning microscope operating to perform AFM (Atomic Force Microscopy) using methods known in the art and described herein. As a result, in a preferred embodiment the invention provides for a device which is suitable both for AFM purpose and for implantation purpose. In a first operating step to perform atomic force microscopy, herein generally referred to as "the AFM method", the device will scan with the cantilever tip a substrate surface, provided possibly with structures extending in the z direction, and store the thereby obtained image and position data. In a subsequent operating step for particle implantation on the substrate surface, the stored position data can then be used for precisely approaching those fields on which a particle is to be implanted by means of the same cantilever.

Further advantageous features of the invention are revealed in the sub-claims.

Figure 2:
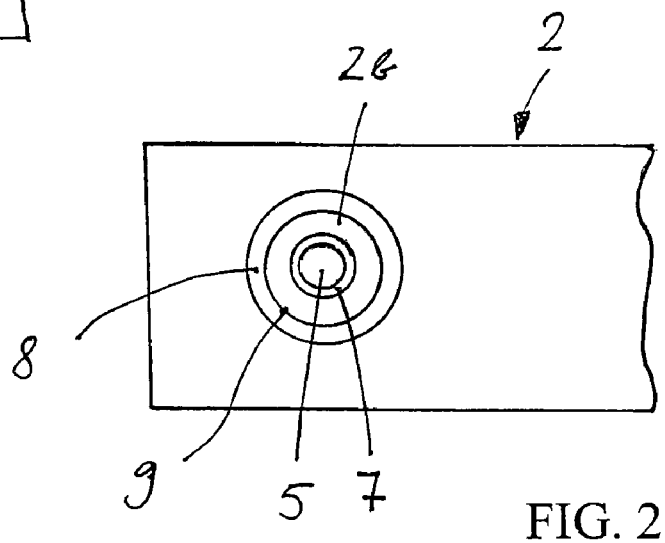
Figure 3:
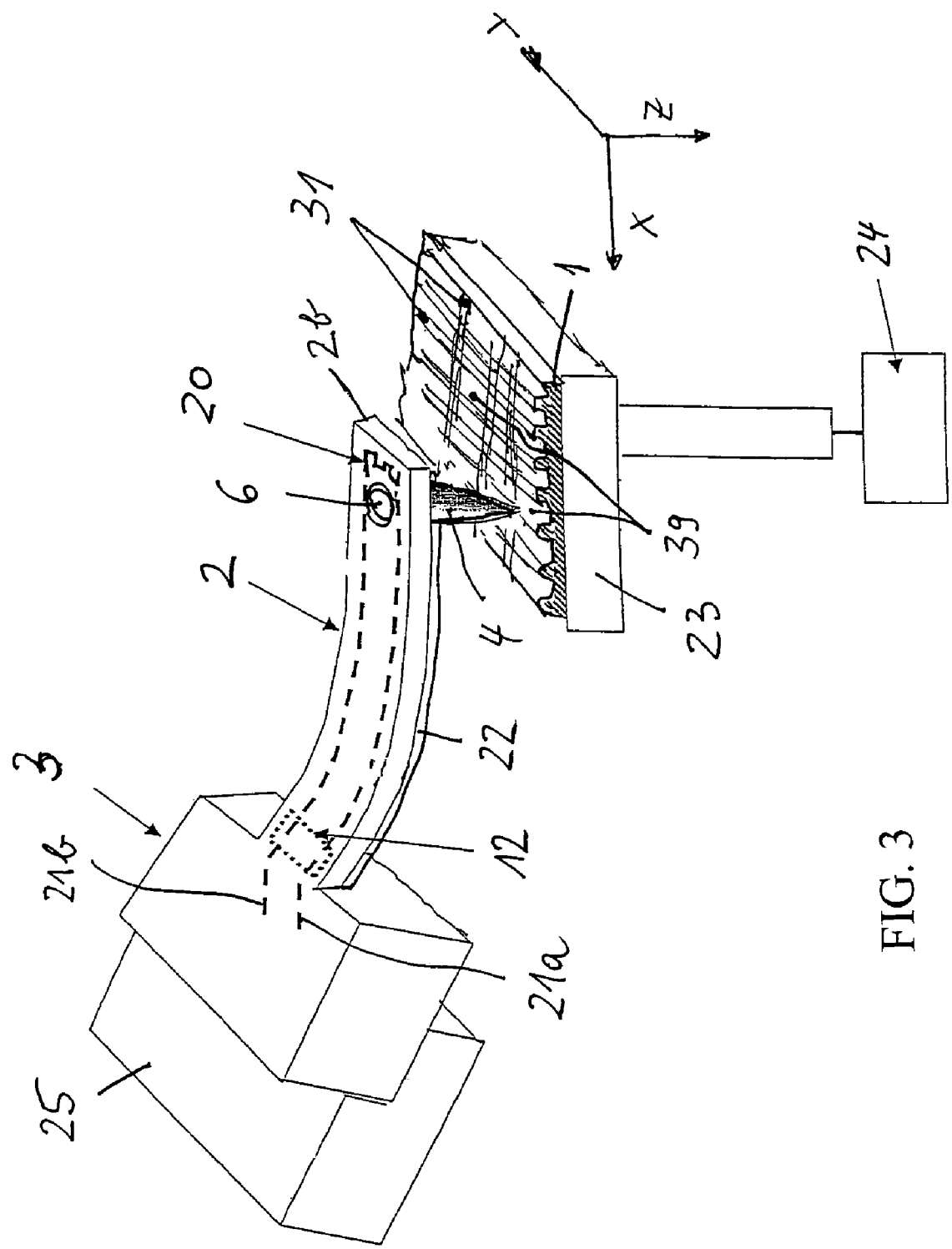
Figure 4:
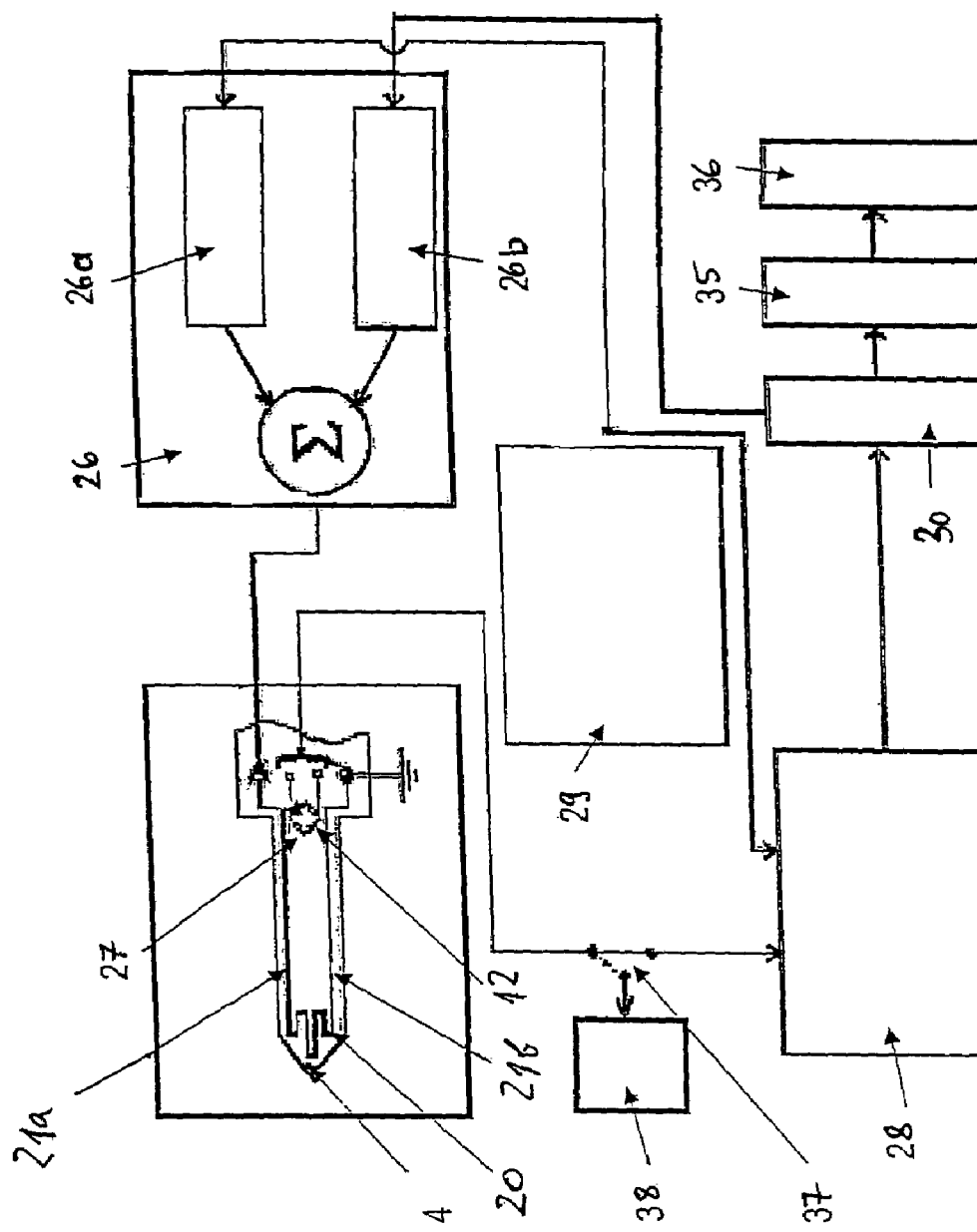
Figure 5:
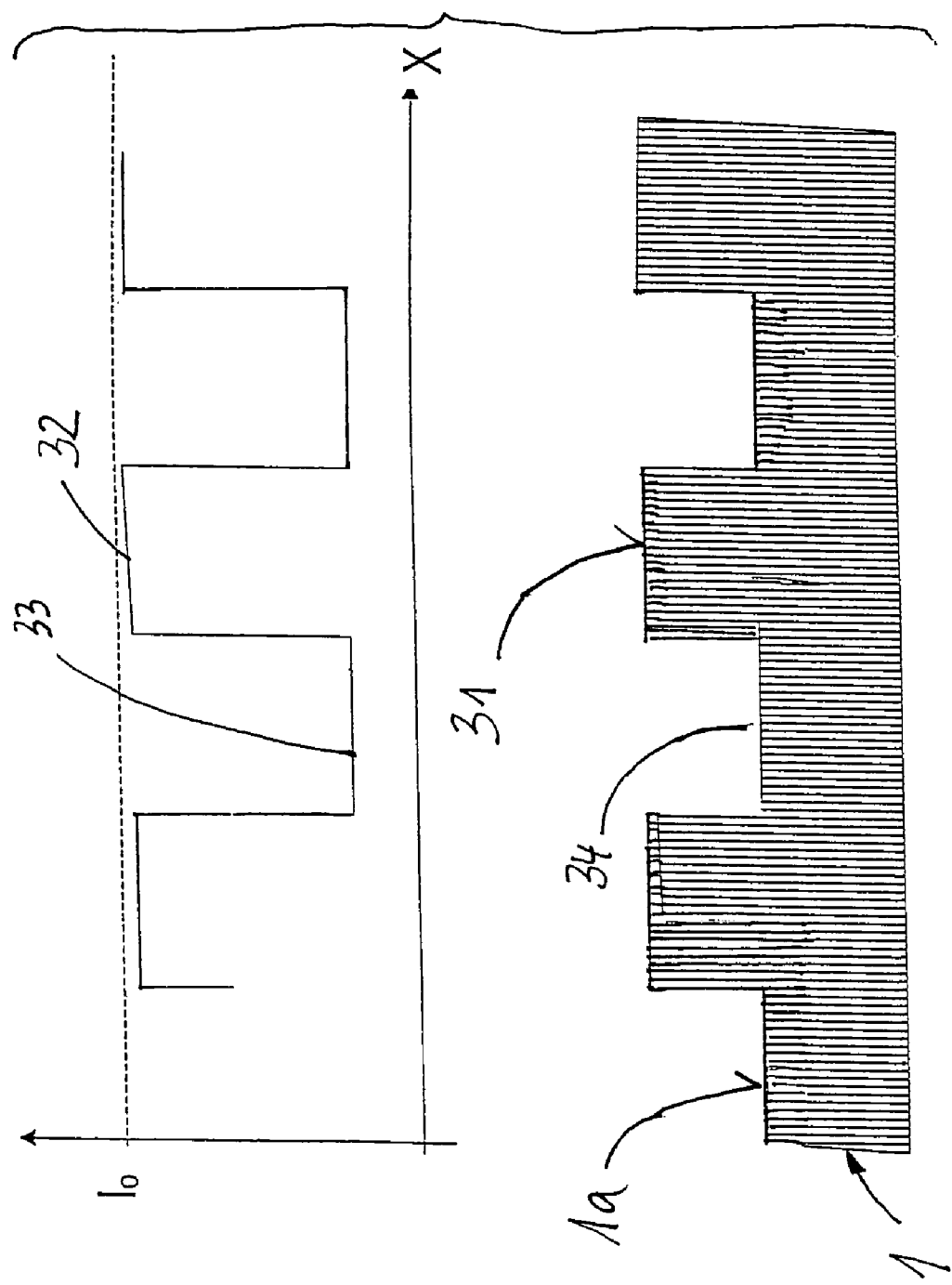

The invention is explained in more detail subsequently by an embodiment in conjunction with the annexed drawings, which show:

FIG. 1 schematically a longitudinal section through a device according to the invention for implantation of individual particles;

FIG. 2 an enlarged view from below of the device according to FIG. 1 in the region of a tip;

FIG. 3 the combination of the device according to FIGS. 1 and 2 with a power microscope;

FIG. 4 schematically a circuit arrangement for the device according to FIG. 3; and FIG. 5 schematically a measurement curve obtained with the circuit arrangement according to FIG. 4.

According to FIGS. 1 and 2, a device for positionally accurate implantation of individual particles in a surface 1a of a substrate 1 formed from silicon according to the embodiment of the invention which is regarded at present as the best, contains a component which is configured as a flexible arm 2 or cantilever which is to be mounted on one side and is likewise produced from silicon. The flexible arm 2 contains a rear end portion 2a which is secured firmly to a basic body 3 or is mounted in the latter or comprises one piece with the latter, and a free front portion 2b which can be moved up and down or oscillate in the direction of a double arrow v (FIG. 1) by bending the flexible arm 2. The direction of the arrow v thereby corresponds for example to the z axis of an imaginary coordinate system, whilst the directions perpendicular thereto correspond to x or y axes. The surface 1a of the substrate 1, which is orientated towards the flexible arm 2 and is to be implanted with particles, is disposed essentially parallel to a plane spanning the x and y axes.

The end portion 2b is provided on its underside 2c with a projecting tip 4, which protrudes downwardly parallel to the arrow v and has a conical or pyramidal configuration, the free end of said tip being orientated towards the surface 1a of the substrate 1.

According to the invention, the tip 4 forms a diaphragm on the one hand and a detector on the other hand. For this purpose, the tip 4 has a continuous hole 5. The tip 4 is configured with particular advantage as a conical or pyramidal and hence funnel-shaped hollow body, the end of which orientated towards the substrate 1 has the hole 5 which at this point has its smallest cross-section of e.g. 5 nm to 20 mm From there, the hole 5 widens conically in the direction of the end portion 2b in order to open out then into an essentially cylindrical passage 6 penetrating the end portion 2b. The production of the hole 5 can be effected in a known manner by means of a focused ion beam FIB [e.g. P. Grabiec et al in "SNOM/AFM microprobe integrated with piezoresistive cantilever beam for multifunctional surface analysis", Microelectronic Engineering 61–62 (2002), pp. 981–986].

On its inner side, the hollow body forming the tip 4 is provided with a metal overlay 7 which extends up to the upper side 2d of the end portion 2b orientated away from the substrate 1 and covers said upper side likewise at least partially.

The flexible arm 2 including its tip 4 is produced for example from a semiconductor material which is n-doped with phosphorous. In the immediate vicinity of the hole 5, the outer side of the tip 4 is provided on the other hand with a zone 8 which is p-doped with boron so that, as in particular FIG. 2 shows, a p-n junction 9 which surrounds the hole 5 at a small spacing is produced. The p-doped zone 8 is thereby provided with an electrode 10 which is insulated relative to the n-doped layer and the furthermore n-conductive flexible arm 2 is provided with a further electrode 11, both electrodes being able to be connected to the positive or negative pole of a voltage source. The p-n junction 9 represents a detector for secondary electrons in a manner explained further on.

According to FIG. 1, a piezoresistive sensor 12 is set into the flexible arm 2 in the vicinity of the stationary end portion 2a. The mechanical stress acting locally on the flexible arm 2 can be calculated inter alia with such a sensor 12 since the resistance of the sensor changes according to the formula $$\Delta R/R = \delta_l \Pi_l + \delta_t \Pi_t$$

R denotes therein the resistance of the sensor 12, $\Delta R$ the resistance change, $\delta_l$ and $\delta_t$ the lateral or transverse stress components and $\Pi_l$ and $\Pi_t$ the transverse or lateral, piezoresistive coefficients (cf. e.g. Reichl et al in "Semiconductor sensors", expert Press 1989 p. 225). Preferably, the sensor 12 is disposed at a position of the flexible arm 2 where the highest mechanical stresses are produced in order to obtain a high signal-to-noise ratio.

A particle source 14, which is not illustrated in more detail, is disposed above the described device, in particular above the end portion 2b of the flexible arm 2, from which source selected particles 15, preferably charged ions and, with particular advantage, highly charged ions with more than 2+, are produced and are accelerated with means which are known per se [e.g. a.a.o. J. Vac. Sci. Technol. B 20 (6)] in the direction of the upper side of the end portion 2b. The direction of the particle beam is thereby chosen such that particles, which are transported on a path of motion coaxial to the hole 5, can pass through the hole 5 without being impeded, whilst most of the other particles impact on the metal overlay 7 and are absorbed by the latter. The tip 4 hence forms a diaphragm which only allows selected particles to pass. The metal overlay 7 acts thereby as a stop layer which impedes impact of the particles on the flexible arm 2 formed e.g. from silicon, passage through the latter and hence in particular undesired damage inter alia of the p-n junction 9.

Another pre-diaphragm 16 made of metal is disposed preferably between the particle source 14 and the metal overlay 7, said pre-diaphragm being provided with an opening 17 which is coaxial to the hole 5. This pre-diaphragm 16 can be used for the purpose of deflecting the ion beam in the case where the particles are ions, by means of negative or positive charging and as a result stopping passage through the hole 5, undesired impact of the ions on other parts of the device being prevented simultaneously.

The mode of operation of the described device is essentially as follows:

If the surface 1a of the component 1 is to be implanted with particles 15, the free end of the tip 4 or the hole 5 thereof is disposed close above the surface 1a when the particle source 14 is switched on, a spacing of preferably approximately 20 nm to 50 nm being maintained. The particle flow is for example adjusted for this purpose such that approximately $10^{12}$ particles per second and per $cm^2$ are moved in the direction of the surface 1a and only very few particles per second can pass through the hole 5. A measurement voltage is applied simultaneously to the p-n junction 9 and the continuous flow is monitored.

If a particle 15 impinges on the surface 1a, then this results in a secondary electron emission from the surface 1a in the direction of the tip 4. If these secondary electrons proceed to the n-material close to the p-n junction 9, then the resistance of the diode changes correspondingly with the result that a current impulse—even although small—is produced. This electric signal lets it be detected that a particle has impinged upon the surface 1a, and is regarded simultaneously as proof that the relevant particle 15 has been implanted in the surface 1a. The signal is of course all the greater, the greater is the number of secondary electrons, this number for its part being all the greater, the more highly charged are the particles or ions (preferably >10+). Apart from this, the spacing of the hole 5 from the surface 1a can be changed by displacement of the substrate in the z direction and hence the detectability of the signal can be optimised. In this manner it can be proved with a probability of over 80% that a particle has been implanted.

After the appearance of a signal which can be attributed to secondary electrons, by applying a deflection voltage to the pre-diaphragm 16 or by switching off the particle source 14, further particles are prevented from proceeding to the same position of the substrate surface 1a. The substrate 1 is then moved in the x and/or y direction until the next position for a desired implantation is reached.

According to a particularly preferred development of the invention, the device described with reference to FIGS. 1 and 2 is integrated into a power microscope which operates according to the AFM method and is intended for scanning the surface of microtechnological components. Basically, numerous power microscopes are known for these purposes (e.g. Technical University Berlin "Methods of Applied Physics—Experiment: AFM Atomic Force Microscopy" by Prof. Dr. Dieter Bimberg, www.physik.TU-Berlin.DE/institute/IFFP). The device described subsequently with reference to FIGS. 3 and 4 is however considered as particularly well suited, the particle source 14 and other parts having been left out in order to simplify the representation.

According to FIG. 3, the front end portion 2b of the flexible arm 2 is provided in addition with a heating wire actuator 20. This comprises for example a resistance heating element or a heating wire or the like, which is laid in an extended or helical fashion, which effects local heating of the flexible arm 2 in the region of the end portion 2b during conduction of an electric current. Supply lines to the actuator 20 are indicated in FIG. 3 with the reference numbers 21a, 21b.

On the underside of the flexible arm 2, as is indicated likewise in FIG. 3, a strip 22 is applied which is made of a material which has a greatly different heat expansion coefficient in comparison to the basic material of the flexible arm 2, as applies for example to aluminium. The strip 22 comprises therefore for example a 1 μm to 3 μm thick aluminium film.

The described measurement arrangement according to FIG. 3 can be used both for the grid-shaped scanning of the surface 1a of the component 1 to be examined according to the AFM method and for implantation of the component 1 in the direction of FIGS. 1 and 2. For this purpose, the component 1 is placed on a table 23 of an AFM device illustrated roughly schematically in FIG. 3, the table 23 being able to be moved up and down, on the one hand, by means of a Z drive 24 in the direction of the z axis of an imaginary coordinate system and being able to be moved to and fro, on the other hand, by means of further preferably piezoelectronic drives in the x or y direction of the coordinate system. The basic body 3 is on the other hand mounted securely in a mounting 25 when the tip 4 of the flexible arm 2 is disposed above the component 1. According to FIG. 4, the heating wire actuator 20 is connected simultaneously to a current source 26 for example by means of supply lines 21a, 21b. In addition, the piezoresistive sensor 12 (FIG. 1) is connected preferably in a bridge circuit 27 which is indicated only schematically and from which an electric voltage, which is characteristic for the resistance change ΔR/R of the sensor 12 or for the mechanical tension of the flexible arm 2, is taken. This electrical voltage is supplied to a first input of a comparator 28.

The current source 26 has on the one hand an alternating current generator 26a, which is connected to the output of an alternating voltage generator 29, and on the other hand a direct current generator 26b which is connected to the output of a controller 30. The output voltage of the alternating voltage generator 29 is supplied also to a second input of the comparator 28 as reference voltage. An output of the comparator 28 is connected finally to an input of the controller 30.

Before examination of the component 1, its surface 1a is firstly scanned by means of the AFM method and preferably in the so-called "non-contact" mode, i.e. without touching, in order to obtain as a result an image of the surface 1a and the precise coordinates of positioning lines 31 which have been applied in advance, said lines being indicated schematically in FIG. 3 and projecting as a rule somewhat beyond the otherwise generally planar surface 1a. In a preferred embodiment, the scanning step by the AFM method can be implemented for example as follows:

After the component 1 has been placed on the table 23, the latter is moved firstly parallel to the z direction up to the limit stop of the surface 1a towards the tip 4 and then is retracted again slightly by e.g. 0.5 μm in order that the tip 4 lies definitely above the highest elevation of the surface 1a or of the positioning lines 31. By means of the alternating voltage generator 26a, an alternating current is then supplied to the heating wire actuator 20 in order to heat it periodically. As a result, different heat expansions are produced for the aluminium strip 22 which is secured to the flexible arm 2 on the one hand and the adjacent material of the flexible arm 2 on the other hand so that the flexible arm 2 is slightly bent with the frequency of the alternating current in the manner of a bimetal strip or is made to oscillate mechanically, the amplitude of these oscillations requiring to be only a few nanometres. Subsequently, a direct current is supplied in addition to the heating wire actuator 20 by means of the direct current generator 26b in such a manner that the flexible arm 2 experiences a uniform bending parallel to the z axis and in the direction of the surface 1a of the component 1 and approaches the tip 4 of the surface 1a apart from a desired small value without touching it. The bending of the flexible arm 2 produced by the direct current component in the z direction can be e.g. up to a few micrometers.

The tip 4 now oscillates at the frequency of the exciting alternating current or of the alternating voltage emitted by the alternating voltage generator 29, the flexible arm 2 being able to be regarded as a spring and the tip 4 as the mass of a system which is capable of oscillating. The excitement of this oscillating system is effected preferably at the resonance frequency of this oscillating system. In the undamped state, i.e. at a large spacing of the tip 4 from the surface 1a, the signal measured by the sensor 12 would follow the exciting signal essentially without phase displacement.

In fact, the direct voltage component supplied to the heating wire actuator 20 is however chosen such that the tip 4 is located so closely to the surface 1a that van der Waals' attractive forces take effect, as is typical for the so-called "non-contact" mode of the AFM method. The oscillations of the flexible arm 2 are damped as a result with the consequence that the signal generated by the sensor 12 lags the exciting signal by a specific phase angle The size of the resultant phase displacement is dependent upon the average spacing of the tip 4 from the surface 1a measured in the z direction. The phase displacement is all the greater, the smaller this spacing is.

The tip is now guided in a grid-shape in the x and y direction over the surface 1a. If it impinges thereby on a positioning line 31 or the like, then the damping is changed and hence the phase displacement between the voltages emitted by the alternating voltage generator 29 and by the sensor 12. The respective phase displacement is measured in the comparator 28 which is preferably configured as a PLL component (phase-locked loop). The resultant value is supplied from the comparator 28 to the controller 30 which is configured preferably as a PID controller. Thereupon, the latter controls the direct current generator 26b such that the tip 4 is more or less raised or lowered and consequently the spacing between it and the surface 1a of the component 1 is kept constant, which corresponds to the AFM method operating at a constant spacing. The parts 12, 20, 28, 30 and 26b hence form a closed control circuit, the sensor 12 determining the respective actual value, whilst the controller 30 prescribes a prescribed reference value for the spacing of the tip 4 from the component 1.

The result of a regulation of this type is illustrated schematically in the upper part of FIG. 5 in which, along the abscissa, the position of the tip 4 is plotted e.g. in the direction of the x axis and, along the ordinate, the direct current supplied to the heating wire actuator 20 is plotted. A small (or large) value of the direct current in a portion of the curve 32 (or 33) thereby implies a small (or large) bending of the flexible arm 2 in the direction of the table 23 (FIG. 3) relative to a preselected zero position 11, which is tantamount to for example a positioning line 31 or with a recess 34, in the z direction, of the surface 1a situated between two positioning lines 31. The portions of the curve 32, 33 convey therefore a positive image of the scanned surface topology of the scanned component 1.

The output signals of the controller 30 or signals corresponding to the current values in FIG. 5 are supplied together with the addresses assigned to them in the form of x and y coordinates, which are obtained by means of non-illustrated locators or the like, to a processing unit 35 (FIG. 4) and, after suitable processing, to a data memory 36 as "image" data. It is then evident from these data and their addresses precisely where the positioning lines 31 or the like required for the subsequent implanting of the component 1 are disposed.

During the now subsequent implantation of the component 1, the device described with reference to FIG. 3 to 5 is likewise used. For this purpose, the piezoresistive sensor 12 or the bridge circuit 27 is connected by means of a commutator 37 (FIG. 4) to a measuring device 38 which directly indicates e.g. in digital form the mechanical stress, under which the flexible arm 2 is already placed, or indicates the force with which the tip 4 is pressing onto the surface 1a of the component 1.

At the beginning of an implantation process, the addresses of the positioning lines 31 present in the data memory 36 are used for actuating the x and y drives of the table 23 in order to adjust the tip 4 respectively to a preselected positioning line 31. Thereafter, the table 23 is moved by means of the x and y drives in addition by as many steps in x and/or y direction such that a free field 39 of the surface 1a defined by the positioning lines 31 comes to be situated under the tip 4. The required number of steps is known since the grid measurement or the spacing of the positioning lines 31 from each other is known. Subsequently, the implantation of a particle is effected in such a manner as described above with reference to FIGS. 1 and 2 until the detector formed from the p-n junction indicates the conclusion of the implantation. Thereupon, the particle flow is halted, the table 23 is moved in the x and y direction so that the next field 39 to be implanted lies under the tip 4 and an implantation is undertaken once again.

A particular advantage of the device described with reference to FIG. 3 to 5 resides in the fact that the arrangement containing the flexible arm 2 (FIGS. 1 and 3) combines all the means required both for the grid-shaped scanning and for implantation of the components 1. In addition, the sensor 12 can be used additionally for the purpose of adjusting the tip 4 relative at a convenient spacing relative to the surface 1a of the component 1 during implantation. For this purpose, for example after disposing the tip 4 above the field 39 to be implanted and after switching over the commutator 37 to the measuring device 38, the table 23 is raised until the tip 4 touches the surface of the relevant field 39 which can be read-out on the measuring device 38. Subsequently, the table 23 is lowered in the z direction by a specific dimension of e.g. 20 nm to 50 nm. The tip 4 can be adjusted in this manner during implantation to a spacing from the surface of the field 39 which is smaller than the height of the positioning lines 31 beyond this surface.

In order to accelerate the implantation process, it is possible to effect the implantation of the component 1 in that at least two tips 4 are disposed above selected fields 39 of the component at the same time. In this case, the described device is equipped with a corresponding number of arrangements according to FIGS. 1 and 2. It is then required only to dispose the various tips 4 at a spacing from each other corresponding to the grid spacing of the fields 39 in order that, after the positionally accurate positioning of a selected tip 4 above a selected field 39, all the other available tips 4 are automatically disposed above one of the fields 39.

The invention is not restricted to the described embodiments which can be modified in many ways. This applies in particular to the indicated shapes, dimensions and materials of the devices according to the invention. It is possible for example to integrate the bridge circuit 27 (FIG. 4) completely into the flexible arm 2 or into the basic body 3 or to fit only the actual sensor 12 in the flexible arm 2. Furthermore, the supply lines 21a, 21b and the heating wire actuator 20 can be at a more or less wide spacing from the aluminium strip 22, the heating wire actuator 20 also being able to be replaced by other actuators. The arrangement of the lines 31 and fields 39 and the geometric shapes of the parts 2 to 12 serve also only by way of example and can be varied in many respects. It is understood in addition that the various features can be applied in combinations other than those illustrated and described. The detector may be a tunnel junction instead of the p-n junction 9, or other suitable detector. The detector need not be placed in the immediate vicinity of hole 5 on the outside of tip 4 at zone 8, but may be further up the tip at zone 8a, or on the cantilever at zone 8b, or even external at zone 8c to which secondary electrons are guided by electric and magnetic fields. When the detector is on the cantilever away from the tip, it is capacitively decoupled from ion noise in the tip collimator. The invention includes the method of implanting particles as described above without the step of detecting the implantation, i.e. without detecting secondary electrons.

The invention claimed is:

1. Device for positionally accurate implantation of individual particles in a substrate surface (1a) with a component which has a diaphragm for a particle beam to be directed towards the substrate surface (1a) and a detector provided thereon or nearby for detecting a secondary electron flow produced upon impact of a particle onto the substrate surface, characterized in that the component is a flexible arm (2), which is to be mounted on one side, with a free end portion (2b), having an upper side (2d) and underside (2c), which, on its underside (2c), has a tip (4) forming the diaphragm and provided with the detector.

2. Device according to claim 1, characterized in that the tip (4) is a body with a hollow conical or hollow pyramidal configuration and provided at its end with a hole (5).

3. Device according to claim 2, characterized in that the tip (4) is provided on its inner side with a metal overlay (7).

4. Device according to claim 3, characterized in that the metal overlay (7) also covers the upper side (2d) of the end portion (2b) at least partially.

5. Device according to claim 1, characterized in that the detector contains a p-n junction (9) or a tunnel junction fitted on the outer side of the tip (4) or on the arm (2).

6. Device according to claim 1, characterized in that a pre-diaphragm (16) formed from metal is disposed above the upper side (2d) of the end portion (2b).

7. Device according to claim 1, characterized in that the flexible arm (2) is provided with a piezoresistive sensor (12).

8. Device according to claim 1, characterized in that it has at least one second component according to claim 1.

9. Device according to claim 1, characterized in that it is disposed in a scanning device, which can perform atomic force microscopy and is intended for scanning the surfaces of microtechnological components with a scanning tip, wherein the tip (4) forming at the same time the scanning tip of the scanning device.

10. Scanning device for scanning the surfaces of microtechnological components, containing storage for image and position data and at least one flexible arm (2) with a free end portion (2b) provided with a scanning tip (4), characterized in that the flexible arm (2) is configured according to claim 1, wherein the scanning device scans a surface with the scanning tip (4) and stores the obtained image and position data in said storage.

11. Method for exact implantation of individual particles in a substrate surface (1a), the particles being directed through a diaphragm towards the substrate surface (1a) for implantation of particles in said surface, secondary electron flows produced as a result being measured and electrical signals produced by the secondary electrons being used as proof of the implantation of the particles, characterized in that a tip (4) of a flexible arm (2b) provided with a hole (5) is used as diaphragm, by means of which scanning of the substrate surface (1a) with the tip (4) and storing the obtained surface data is undertaken before implantation, and in that the tip (4) is positioned during implantation applying the data obtained during the scanning.

12. Method according to claim 11, characterized in that the free end of the tip (4) is disposed during implantation at a spacing of 10 nm to 50 nm above the substrate surface (1a).

13. Method according to claim 11, characterized in that charged particles are used as particles.

14. Method according to claim 13, characterized in that highly charged ions (>2+) are used as particles.

15. Method according to claim 11, characterized in that the secondary electron flows are detected with a p-n junction (9) or a tunnel junction which is integrated into the tip (4) or on the flexible arm (2b).

16. Method according to claim 11, characterized in that the deflections of the flexible arm (2b) are measured relative to the substrate surface (1a) by piezoresistive means (12).

17. Method according to claim 11, characterized in that the substrate surface (1a) is implanted with particles simultaneously by at least two flexible arms (2) according to claim 11.

18. Method for exact implantation of individual particles in a substrate surface (1a), the particles being directed through a diaphragm towards the substrate surface (1a), characterized in that a tip (4) of a flexible arm (2b) provided with a hole (5) is used as diaphragm, by means of which scanning of the substrate surface (1a) with the tip (4) and storing the obtained surface data is undertaken before implantation, and in that the tip (4) is positioned during implantation applying the data obtained during the scanning.

19. Method according to claim 18, characterized in that the free end of the tip (4) is disposed during implantation at a spacing of 10 nm to 50 nm above the substrate surface (1a).

20. Method according to claim 18, characterized in that charged particles are used as implantation particles.

21. A method for exact implantation of individual particles in a substrate surface (1a), comprising the steps of:
(a) providing a substrate surface (1a) and a device comprising a component having a diaphragm for a particle beam to be directed towards the substrate surface (1a) and a detector provided thereon or nearby for detecting a secondary electron flow produced upon impact of a particle onto the substrate surface, characterized in that the component is a flexible arm (2), which is to be mounted on one side, with a free end portion (2b), having an upper side (2d) and underside (2c), which, on its underside (2c), has a tip (4) forming the diaphragm and provided with the detector, wherein the tip (4) is provided with a hole (5), and further comprising storage for image and position date;
(b) scanning of the substrate surface (1a) with the tip (4);
(c) storing in said storage the image and position data of the surface obtained by scanning the surface with said tip;
(d) positioning said tip at a specific position over said surface;
(e) directing particles through the diaphragm towards the substrate surface (1a), whereby implantation of said particles occurs at said specific position in said surface;
(f) measuring secondary electron flows produced and electrical signals produced by the secondary electrons as proof of the implantation of the particles.

22. The method according to claim 21, wherein the device is characterized in that the free end of the tip (4) is disposed during implantation at a spacing of 10 nm to 50 nm above the substrate surface (1a).

23. The method according to claim 21, wherein said particles are charged.

24. The method according to claim 23, wherein said charged particles are highly charged ions (>2+).

25. The method according to claim 21, wherein the secondary electron flows are detected with a p-n junction (9) or a tunnel junction which is integrated into the tip (4) or on the flexible arm (2b).

26. The method according to claim 21, wherein the scanning step measures the deflections of the flexible arm (2b) relative to the substrate surface (1a) by piezoresistive means (12).

27. The method according to claim 21, wherein the substrate surface (1a) is implanted with particles simultaneously by at least two flexible arms (2) according to claim 21.

* * * * *